United States Patent
Hsu et al.

(10) Patent No.: US 9,166,045 B1
(45) Date of Patent: Oct. 20, 2015

(54) HIGH-K DIELECTRIC DEVICE AND PROCESS

(71) Applicant: Altera Corporation, San Jose, CA (US)

(72) Inventors: Che Ta Hsu, San Jose, CA (US);
Fangyun Richter, San Jose, CA (US);
Ning Cheng, San Jose, CA (US); Jeffrey Xiaoqi Tung, Palo Alto, CA (US)

(73) Assignee: Altera Coporation, San Jose, CA (US)

( * ) Notice: Subject to any disclaimer, the term of this patent is extended or adjusted under 35 U.S.C. 154(b) by 0 days.

(21) Appl. No.: 14/473,953

(22) Filed: Aug. 29, 2014

Related U.S. Application Data

(62) Division of application No. 13/525,864, filed on Jun. 18, 2012, now Pat. No. 8,835,265.

(51) Int. Cl.
| | |
|---|---|
| *H01L 21/336* | (2006.01) |
| *H01L 29/78* | (2006.01) |
| *H01L 29/66* | (2006.01) |
| *H01L 21/311* | (2006.01) |
| *H01L 21/02* | (2006.01) |
| *H01L 27/092* | (2006.01) |

(52) U.S. Cl.
CPC ........ *H01L 29/7833* (2013.01); *H01L 21/0217* (2013.01); *H01L 21/02115* (2013.01); *H01L 21/02126* (2013.01); *H01L 21/31111* (2013.01); *H01L 27/092* (2013.01); *H01L 29/66553* (2013.01)

(58) Field of Classification Search
CPC ............... H01L 29/66553; H01L 21/8232; H01L 29/66477
USPC ............. 438/689, 694, 696, 734, 197
See application file for complete search history.

(56) References Cited

U.S. PATENT DOCUMENTS

| | | | | |
|---|---|---|---|---|
| 5,023,190 A | * | 6/1991 | Lee et al. | 438/200 |
| 5,045,901 A | * | 9/1991 | Komori et al. | 257/344 |
| 5,231,038 A | * | 7/1993 | Yamaguchi et al. | 438/303 |
| 5,538,913 A | * | 7/1996 | Hong | 438/282 |
| 5,571,738 A | * | 11/1996 | Krivokapic | 438/291 |
| 5,698,461 A | * | 12/1997 | Liu | 438/291 |
| 5,801,075 A | * | 9/1998 | Gardner et al. | 438/197 |
| 5,877,056 A | * | 3/1999 | Wu | 438/291 |
| 5,891,787 A | * | 4/1999 | Gardner et al. | 438/424 |
| 5,899,719 A | * | 5/1999 | Hong | 438/289 |
| 5,953,602 A | * | 9/1999 | Oh et al. | 438/201 |
| 6,005,272 A | * | 12/1999 | Gardner et al. | 257/344 |
| 6,025,635 A | * | 2/2000 | Krivokapic | 257/412 |
| 6,049,107 A | * | 4/2000 | Peidous | 257/336 |
| 6,093,945 A | * | 7/2000 | Yang | 257/317 |
| 6,100,146 A | * | 8/2000 | Gardner et al. | 438/301 |
| 6,153,904 A | * | 11/2000 | Yang | 257/316 |

(Continued)

*Primary Examiner* — Michele Fan
(74) *Attorney, Agent, or Firm* — Ward & Zinna, LLC

(57) ABSTRACT

In an illustrative embodiment, holes are formed in an insulating layer where the gates of NMOS and PMOS transistors are to be formed; and a hard mask spacer layer is formed on the exposed surfaces. Next, spacers are formed on the sidewalls of the holes by anisotropically etching the spacer layer to remove the portion of the spacer layer exposed at the bottom of each hole while leaving some of the spacer layer formed on the sidewalls of the holes. A high-k dielectric layer is then formed between the spacers; and a metal layer is formed on the high-k dielectric layer. Bulk metal layer is then formed on the metal layer. Chemical mechanical polishing is performed to remove the bulk gate metal down to the insulating layer, thereby isolating individual NMOS and PMOS gate structures.

16 Claims, 3 Drawing Sheets

(56) References Cited

U.S. PATENT DOCUMENTS

| | | | |
|---|---|---|---|
| 6,155,537 A * | 12/2000 | Yang | 254/314 |
| 6,249,022 B1 * | 6/2001 | Lin et al. | 257/324 |
| 6,319,776 B1 * | 11/2001 | Tung | 438/270 |
| 6,329,258 B1 * | 12/2001 | Inaba | 438/305 |
| 6,358,800 B1 * | 3/2002 | Tseng | 438/268 |
| 6,388,922 B1 * | 5/2002 | Fujiwara et al. | 365/185.18 |
| 6,501,131 B1 * | 12/2002 | Divakaruni et al. | 257/344 |
| 6,506,639 B1 * | 1/2003 | Yu et al. | 438/197 |
| 6,559,051 B1 * | 5/2003 | Buynoski et al. | 438/678 |
| 6,566,215 B1 * | 5/2003 | Chong et al. | 438/305 |
| 6,656,810 B1 * | 12/2003 | Fukushima | 438/320 |
| 6,946,374 B2 * | 9/2005 | Park | 438/527 |
| 6,951,785 B2 * | 10/2005 | Oh et al. | 438/197 |
| 6,992,353 B1 * | 1/2006 | Wu | 257/335 |
| 2001/0042894 A1 * | 11/2001 | Brigham et al. | 257/408 |
| 2004/0089892 A1 * | 5/2004 | Suzuki | 257/302 |
| 2004/0197998 A1 * | 10/2004 | Lin | 438/265 |
| 2004/0214382 A1 * | 10/2004 | Park et al. | 438/197 |
| 2005/0095798 A1 * | 5/2005 | Cheng et al. | 438/303 |
| 2005/0167729 A1 * | 8/2005 | Jeon et al. | 257/314 |
| 2006/0131619 A1 * | 6/2006 | Wu | 257/260 |
| 2006/0131646 A1 * | 6/2006 | Wu | 257/335 |
| 2007/0075362 A1 * | 4/2007 | Wu | 257/335 |
| 2008/0061342 A1 * | 3/2008 | Lee | 257/303 |
| 2008/0242026 A1 * | 10/2008 | Matsuzaki et al. | 438/264 |
| 2013/0113050 A1 * | 5/2013 | Adkisson et al. | 257/402 |

* cited by examiner

HIGH-K DIELECTRIC DEVICE AND PROCESS

This application is a divisional of application Ser. No. 13/525,864, filed on Jun. 18, 2012, for "HIGH-K DIELECTRIC DEVICE AND PROCESS", which application is incorporated by reference herein in its entirety.

BACKGROUND

This relates to a MOS gate structure and a method for forming the gate. It is especially useful in high-k dielectric last technology and will be described in that context. However, it may also be used in other technologies.

In recent years, the continued progress in reducing the physical size of semiconductors has required a major change in the composition of the gate structure in a PMOS or NMOS transistor. In particular, the thickness of the silicon dioxide insulator became so small that quantum effects resulted in substantial leakage currents through the insulator. As a result, it became necessary to replace the silicon dioxide insulator and, with it, the polysilicon gate. The replacement structure was a metal gate with a high-k dielectric that greatly reduced the leakage current For further details, see M. T. Bohr, et al., "The High-k Solution", *IEEE Spectrum* (October 2007); E. P. Gusev et al, "Advanced High-k Dielectric Stacks with PolySi and Metal Gates: Recent Progress and Current Challenges," *IBM J. Res. & Dev.*, Vol. 50, No. 4/5 (July/September 2006), both of which are incorporated herein in their entireties.

The use of a metal gate and high-k dielectric introduced other issues into the semiconductor device manufacturing process. Of particular importance, high temperature annealing operations performed after implanting operations such as those for forming LDD regions, sources and drains were not compatible with the metal gate and high-k dielectric structures. As a result, fabrication processes were developed and implemented in which the high-k dielectric and metal layer were the last elements to be formed in the process. Such fabrication processes are sometimes referred to as high-k dielectric last processes.

While the high-k dielectric last process has facilitated the implementation of the Semiconductor Roadmap at technology nodes of 65 nm and beyond, the constantly decreasing size of the MOS gate continues to produce challenges. For example, other types of current leakage such as that caused by drain induced barrier lowering (DIBL) remain a problem. And capacitance between the gate and the source/drain (gate-source/drain overlap capacitance (Cov)) interferes with efforts to increase the switching speed of the transistors in devices such as Field Programmable Gate Arrays (FPGA). There are also problems in the fabrication of the structures of the semiconductor devices. For example, as the length of the transistor gates gets smaller and smaller, the size of the holes made in the insulating layer to form the gates should also get smaller except that it becomes increasingly more difficult to fill those holes with gate metallization.

SUMMARY

The present invention is an improved high-k dielectric device and process.

In an illustrative embodiment, an insulating layer is formed on the substrate; and holes are patterned in the insulating layer where the gates of NMOS and PMOS transistors are to be formed. A hard mask spacer layer is formed on the upper surface of the insulating layer, on the substantially vertical sidewalls of the holes, and on the exposed portions of the upper surface of the substrate at the bottom of the holes. Next, the spacer layer is anisotropically etched to remove the portion of the spacer layer exposed at the bottom of each hole as well as the portion of the spacer layer on the upper surface of the insulating layer. However, the etching process does not remove all of the portion of the spacer layer formed on the substantially vertical sidewalls of the holes. Rather, the duration of the etching process is controlled so as to leave a vertical portion of the spacer layer having a desired thickness at the bottom of the hole and a taper that begins part way up the sidewall.

A high-k dielectric layer is then formed on the remaining vertical portion of the spacer layer and on the exposed upper surfaces of the substrate and the insulating layer. A metal layer is then formed on the high-k dielectric layer; and bulk gate metal is then formed on the metal layer. Chemical mechanical polishing is then performed to remove the bulk gate metal down to the insulating layer, thereby isolating individual NMOS and PMOS gate structures. Contacts are then formed to the individual gate structures as well as to other structures in the device. Finally, the wafer is singulated.

As will be described in more detail below, the use of a spacer layer and an anisotropic etching process make it possible to form a device having more uniform dimensions in the gate region. This enables reductions in the overlap capacitance (Coy) and the drain induced barrier lowering (DIBL) effect. It also makes it possible to improve the filling of the high-k dielectric and gate metals in the gate holes.

Numerous variations may be practiced in the invention.

BRIEF DESCRIPTION OF THE DRAWINGS

These and other objects and advantages of the present invention will be apparent to those of ordinary skill in the art in view of the following detailed description in which.

It will be appreciated that the drawings are not to scale.

DETAILED DESCRIPTION

Figure 1:
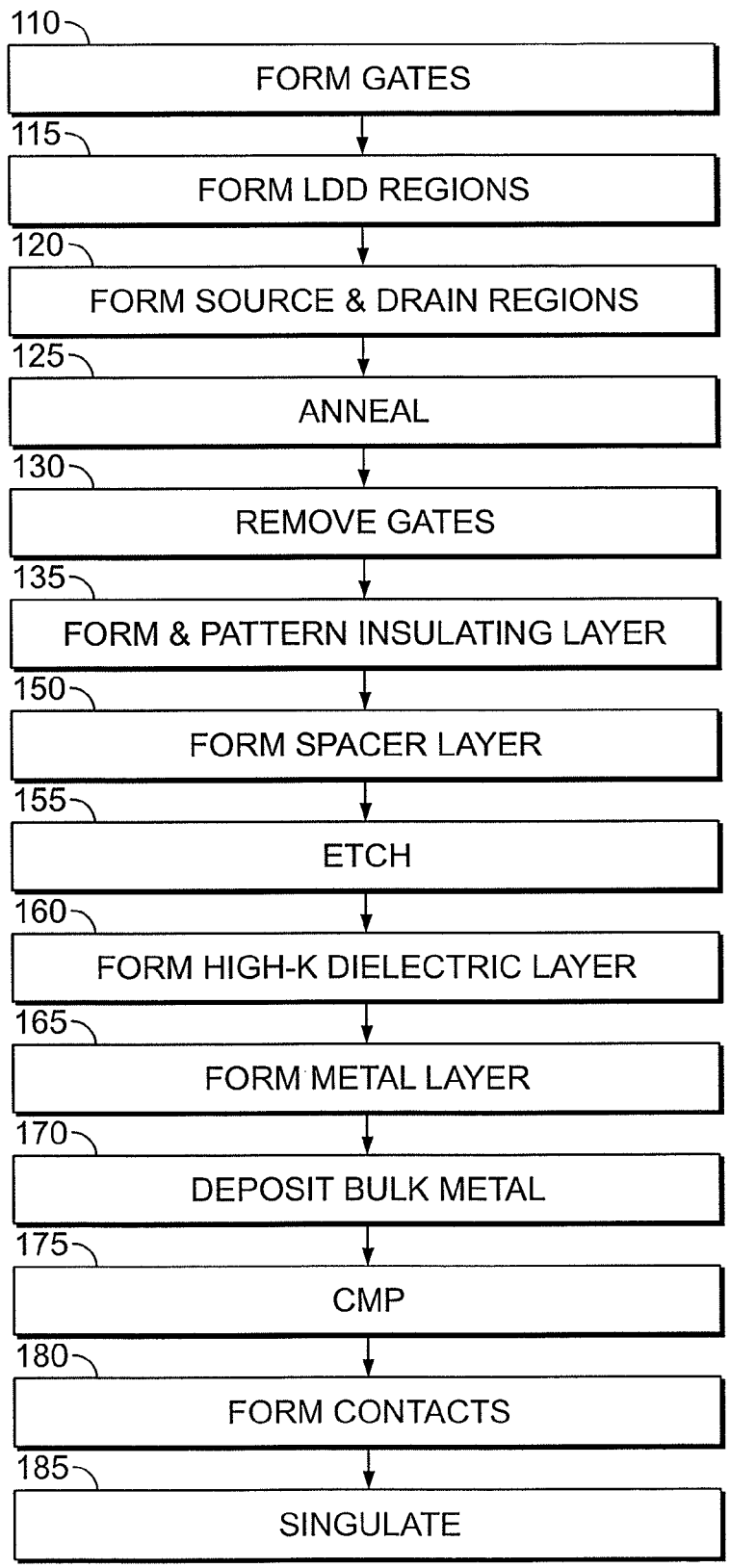
FIG. 1 is a flowchart of an illustrative embodiment of a process of the present invention.

FIG. 1 is a flowchart depicting some of the major steps in making NMOS and PMOS transistors in an illustrative embodiment of the invention. It will be understood that these steps are performed on a semiconductor substrate that typically is a wafer of silicon up to 12 inches (300 cm.) in diameter in today's state-of-the-art processes. Individual PMOS and NMOS transistors are quite small which allows for the formation of several hundred integrated circuits on a single wafer, each integrated circuit having up to a billion or so MOS transistors. FIGS. 2A-2F depict illustrative cross-sections of one such NMOS transistor and one such PMOS transistor at certain steps in the process of FIG. 1.

At step 110 of FIG. 1, polysilicon gates are formed on a substrate wherever a gate will ultimately be used. At step 115, LDD regions are then formed on either side of each gate using the gate as a mask to define where the regions are formed. Next, source and drain regions are formed in the substrate at step 120 again using the gate and side spacers to define where the source and drain regions are formed. Typically, the LDD regions, the source regions and the drain regions are formed by ion implantation of dopants and the damage caused by the ion implantation is thermally annealed at step 125. As will be appreciated by those skilled in the art, both PMOS and NMOS structures are typically formed in the same integrated circuit. This is accomplished by first implanting first portions of the substrate with dopants of one conductivity type and subsequently implanting other portions of the substrate with dopants of the other conductivity type. Further details concerning steps 110 to 125 are set forth in S. A. Campbell, *The Science and Engineering of Microelectronic Fabrication* (2$^{nd}$ ed.) (Oxford 2001); J. D. Plummer et al., *Silicon VLSI Technology Fundamentals, Practice and Modeling* (Prentice Hall 2000), which are incorporated by reference in their entireties.

Figure 2A:
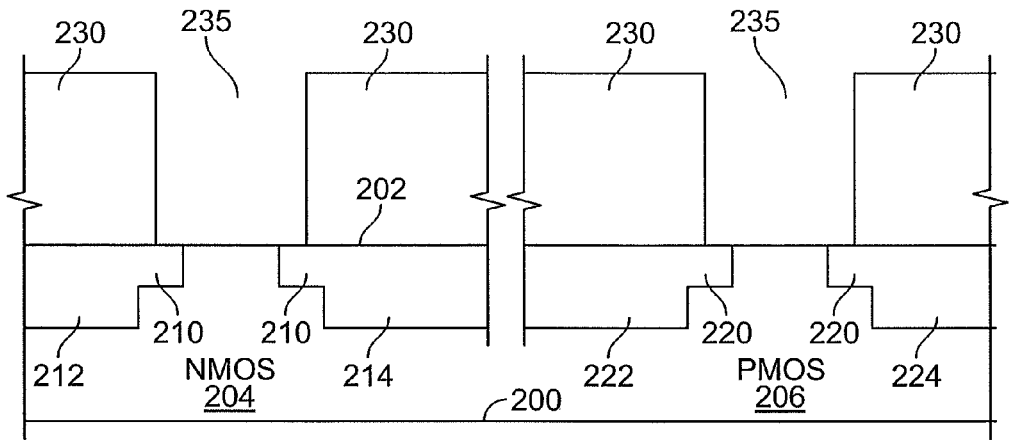
FIGS. 2A-2F are cross-sections of illustrative NMOS and PMOS transistors at various stages of the process of FIG. 1.

In the process depicted in FIG. 1, the polysilicon gates are then removed at step 130 An insulating layer is formed on the substrate and patterned at step 135 to define the regions where the metal gates are to be formed. FIG. 2A depicts an illustrative cross-section of the NMOS and PMOS transistors after step 135. More particularly, FIG. 2A depicts a substrate 200 having an upper surface 202, a first region 204 that is doped with dopants of P-type conductivity and a second region 206 that is doped with dopants of N-type conductivity. It will be appreciated that in a state-of-the-art substrate, there are many billions of such regions 204, 206. In the first region 204 are formed LDD regions 210, a source region 212 and a drain region 214 of N-type conductivity; and in the second region 206 are formed LDD regions 220, a source region 222 and a drain region 224 of P-type conductivity. An insulating layer 230 is formed on the substrate; and holes 235 are patterned in the insulating layer where the gates of the NMOS and PMOS transistors are to be formed. As shown in FIG. 2A, holes 235 extend from an upper surface 232 of insulating layer 230 down to the upper surface 202 of substrate 200. Holes 235 have substantially vertical sidewalls 237.

Figure 2B:
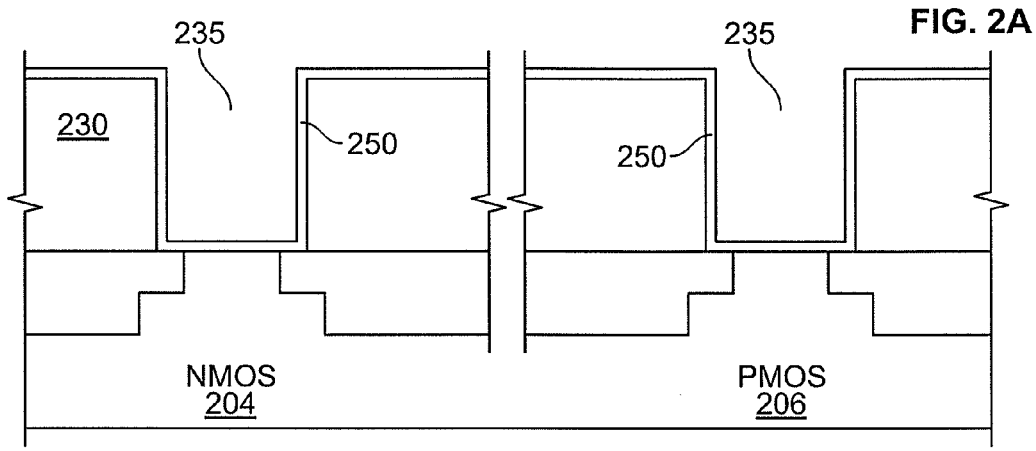

At step 150, a spacer layer 250 is formed on the upper surface of the insulating layer, on the substantially vertical sidewalls of the holes in the insulating layer and on the exposed portions of the upper surface of the substrate at the bottom of the holes. The spacer layer is depicted in FIG. 2B. Illustratively, spacer layer 250 is a hard mask layer made of materials such as silicon nitride, SiNx, carbon-doped silicon dioxide, amorphous/plasma enhanced chemical vapor deposition (PECVD) carbon. Illustratively, the thickness of the spacer layer is in the range of 1 to 10 nanometers (nm) with current technologies and can be expected to decrease in the future.

Figure 2C:
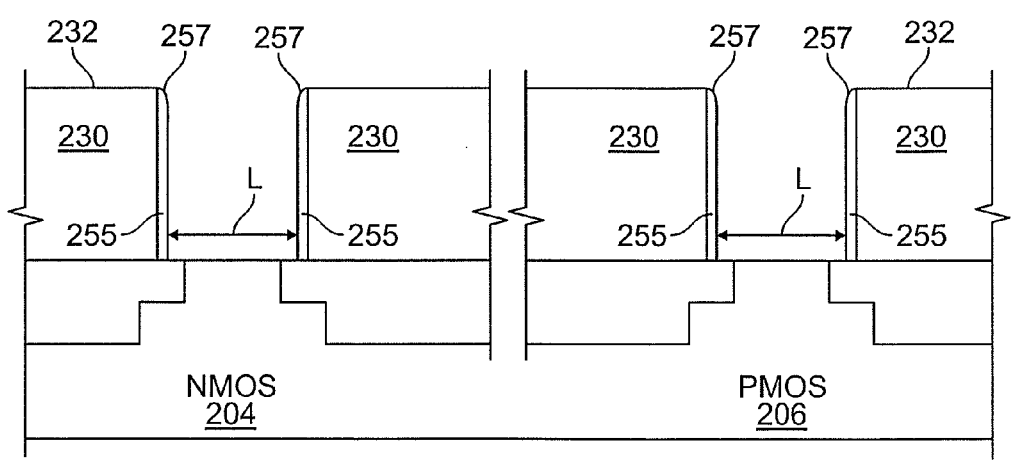

At step 155, the hard mask is etched using a plasma etchant. The etching process is anisotropic with a vertical etch rate that is faster than a lateral etch rate As a result, the etching process removes the material of the spacer layer that lies on a horizontal surface faster than it removes the material that lies on a vertical surface. Specifically, the etching process removes the portion of the spacer layer exposed at the bottom of each hole. Since the etching process operates uniformly on the horizontal surfaces of the device, the process also removes all of the portion of the spacer layer on upper surface 232 of insulating layer 230. However, the etching process does not remove all of the portion of the spacer layer formed on the substantially vertical sidewalls of the holes. Rather, it removes only a portion of the thickness of the vertical portion of the spacer layer, leaving sidewalls 255 separated by a distance L. The amount of the vertical portion of spacer layer 250 that is removed depends on the lateral etch rate of the etchant and the duration of the etching process. At the inside upper edge of the vertical portion of the spacer, the anisotropic etching process produces a taper 257 that begins part way up the sidewall and reduces in thickness moving farther up the sidewall. Thus, the width of the hole grows gradually wider with increasing distance from the bottom of the hole. FIG. 2C depicts an illustrative cross-section after completion of etching step 155.

Suitable anisotropic etchants are known for a wide variety of materials that may be used for the spacer layer. For example, for silicon nitride hard masks, suitable etchants are fluorine deficient fluorocarbon plasmas such as CF4/H2, CHF3, C2HF5 or C4F8.

Figure 2D:
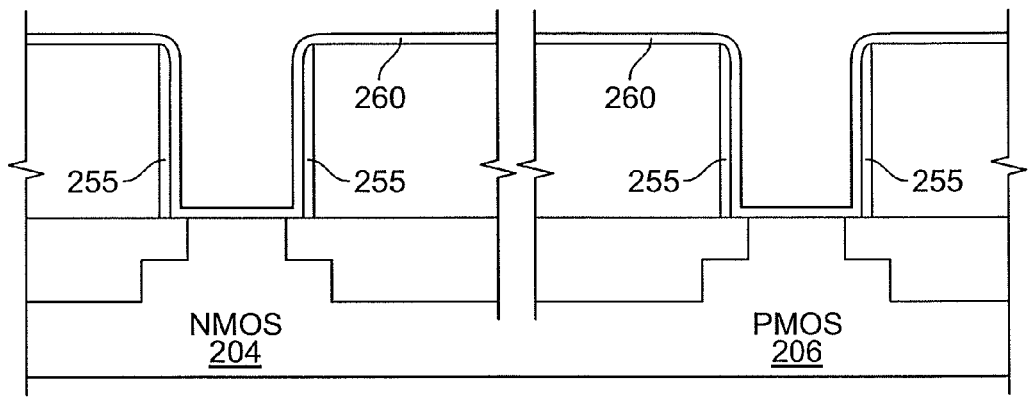

At step 160, a high-k dielectric layer 260 is formed on the remaining vertical portion 255 of spacer layer 250 and on the exposed upper surfaces 202, 232 of substrate 200 and insulating layer 230 as depicted in FIG. 2D. A variety of high-k dielectric materials are available for use. One such material is Hafnium oxide. Typically, the high-k dielectric layer is less than about 10 nm thick.

Figure 2E:
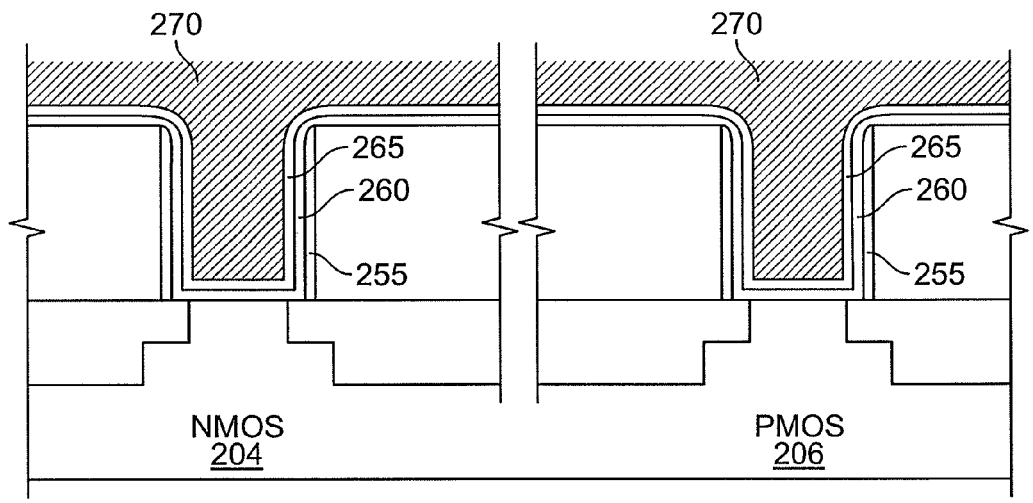

A metal layer 265 is then formed on the high-k dielectric layer 260 at step 165. This layer is typically aluminum and is less than approximately 100 nm thick. Bulk gate metal 270 is then formed on the metal layer at step 170. The resulting structure is shown in FIG. 2E.

Figure 2F:
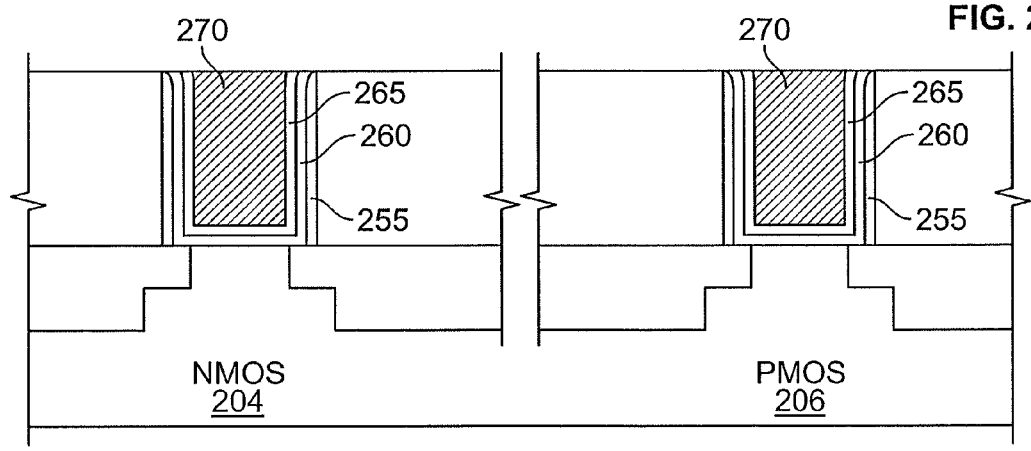

Chemical mechanical polishing is then performed at step 175 to remove the bulk gate metal down to the insulating layer. As shown in FIG. 2F, this isolates the individual NMOS and PMOS gate structures. At step 180, contacts are formed to the individual NMOS and PMOS transistors as well as to other structures in the device. Finally, at step 185, the wafer is singulated so as to separate the integrated circuits into separate dies.

Since the distance L between the sidewalls can be controlled by controlling the thickness of spacer layer 250 and the duration of etching step 155, the length of the high-k dielectric layer 260 and the length of metal layer 265 in the same direction can also be controlled very precisely by controlling the duration of the etching step 155. This makes it possible to control the amount by which the gate overlaps the source and drain regions of the NMOS and PMOS transistors and thereby reduce the device overlap capacitance (Cov). Reductions in overlap capacitance on the order of 50 percent (%) are possible which, in turn, make possible significant improvements in device speed.

Since the length of the gate can be precisely controlled, it is also possible to reduce the drain induced barrier lowering (DIBL) by up to approximately 70 mV which lowers leakage currents by a factor of up to 3. This also makes it possible to use deeper LDD regions which results in lower substrate resistance Rs.

The taper 257 at the upper end of the sidewall spacers 255 provide a structure that facilitates the formation of the high-k dielectric layer 260 and the metal layer 265. The taper provides a relatively smooth transition from the vertical surface of the sidewalls of the holes to the horizontal upper surface of the insulating layer. The taper also ensures that the distance between the sidewalls of the hole at the top of each hole is greater than the distance L between the sidewalls at the bottom of the hole. This funnel shape reduces the likelihood of unwanted accumulation of fill material at the top of the hole and, in general, facilitates filling the holes with gate metallization.

Numerous variations may be practiced in the embodiment depicted in FIGS. 1 and 2A-2F. The hard mask materials used for the spacer layer are only illustrative. Numerous other materials are available for use as the spacer layer and others are being developed. Appropriate anisotropic etches will be apparent for the hard mask materials identified and others are likely to be devised.

While the embodiment of FIGS. 1 and 2A-2F has been described for the case where the same metal layer is used for the gates of both the NMOS and PMOS transistors, the invention may also be practiced where different metal layers are used for the gates of the NMOS and PMOS transistors. In this circumstance, a first metal layer is formed on the high-k dielectric layer as in step 165. This layer is then patterned to form the metal gates for one type of transistors, illustratively, the PMOS transistors. As a result, the upper surface on one portion of the device is the high-k dielectric layer and on a second portion of the device it is the metal layer that is used to form the gates for the PMOS devices. Next, a second metal layer is formed on the entire surface of the devic; and a bulk gate metal is then formed on the second metal layer. The second metal layer serves as the gates for the NMOS devices.

Specific details for the formation of the spacer layer, the high-k dielectric layer, the metal layer, and the bulk metal fill have not been supplied because many such processes are well known in the industry. For example, details of many of these processes are set forth in the above-referenced textbooks of Campbell and Plummer. While the embodiments have been described in terms of single layers, it will be understood that the single layers may be formed of multiple sub-layers that provide a multiplicity of functions.

In the interest of simplicity and to avoid obscuring the invention, only the major steps of the semiconductor fabrication process have been described. It will also be understood that many additional steps and details have been omitted as unnecessary for an understanding of the invention.

What is claimed is:

1. A method for controlling a gate dimension in a MOS structure comprising:
    forming source and drain regions in a semiconductor substrate;
    forming an insulating layer on an upper surface of the semiconductor substrate;
    removing portions of the insulating layer to form a hole that exposes the upper surface of the semiconductor substrate between the source and drain regions previously formed in the semiconductor substrate, wherein the portions of the insulating layer are removed without removing portions of the upper surface of the semiconductor substrate;
    forming a spacer layer on an upper surface of the insulating layer, on sidewalls of the hole in the insulating layer and on the exposed upper surface of the semiconductor substrate in the hole;
    forming spacers on the sidewalls of the hole by etching at a first rate the spacer layer on the upper surface of the semiconductor substrate in the hole to expose the upper surface of the semiconductor substrate and etching at a second rate the spacer layer on the sidewalls of the hole in the insulating layer to reduce the thickness of the spacer layer on the sidewalls;
    forming a dielectric layer between the spacers on the exposed upper surface of the semiconductor substrate in the hole; and
    forming a gate on the dielectric layer formed between the spacers on the exposed upper surface of the semiconductor substrate in the hole.

2. The method of claim 1 wherein forming the source and drain regions comprises forming source and drain regions having a first conductivity type in a portion of the semiconductor substrate having a second conductivity type.

3. The method of claim 1 wherein the first rate is faster than the second rate.

4. The method of claim 1 wherein the spacer layer is a layer of silicon nitride, a layer of carbon-doped silicon dioxide, or a layer of amorphous/plasma enhanced chemical vapor deposition (PECVD) carbon.

5. The method of claim 1 wherein etching at a first rate and etching at a second rate are performed simultaneously using a fluorine-deficient fluorocarbon plasma etchant.

6. The method of claim 1 wherein forming the source and drain regions comprises forming source and drain regions having a first conductivity type in a first portion of the semiconductor substrate having a second conductivity type and forming second source and drain regions having a second conductivity type in a second portion of the semiconductor substrate having a first conductivity type.

7. A method for fabricating an integrated circuit structure in a semiconductor substrate comprising:
    forming source and drain regions by implanting ions of a first conductivity type in the semiconductor substrate;
    forming an insulating layer on an upper surface of the semiconductor substrate;
    removing portions of the insulating layer to form a hole that exposes the upper surface of the semiconductor substrate between the source and drain regions previously formed in the semiconductor substrate, wherein the portions of the insulating layer are removed without removing portions of the upper surface of the semiconductor substrate;
    forming a spacer layer on an upper surface of the insulating layer, on sidewalls of the holes in the insulating layer and on the exposed upper surface of the semiconductor substrate in the hole;
    forming spacers on the sidewalls of the hole by etching at a first rate the spacer layer on the upper surface of the semiconductor substrate in the hole to expose the upper surface of the semiconductor substrate and etching at a second rate the spacer layer on the sidewalls of the hole in the insulating layer to reduce the thickness of the spacer layer on the sidewalls;
    forming a dielectric layer between the spacers on the exposed upper surface of the semiconductor substrate in the hole; and
    forming a gate on the dielectric layer formed between the spacers on the exposed upper surface of the semiconductor substrate in the hole.

8. The method of claim 7 wherein forming the source and drain regions comprises forming source and drain regions having a first conductivity type in a portion of the semiconductor substrate having a second conductivity type.

9. The method of claim 7 further comprising forming LDD regions extending from the source and drain regions.

10. The method of claim 7 further comprising forming electrical connections to the gate, the source region, and the drain region.

11. The method of 7 wherein the first rate is faster than the second rate.

12. The method of claim 7 wherein the spacer layer is a layer of silicon nitride, a layer of carbon-doped silicon dioxide, or a layer of amorphous/plasma enhanced chemical vapor deposition (PECVD) carbon.

13. The method of claim 7 wherein etching at a first rate and etching at a second rate are performed simultaneously.

14. The method of claim 7 wherein etching at a first rate and etching at a second rate are performed simultaneously using a plasma etchant.

15. The method of claim 7 wherein etching at a first rate and etching at a second rate are performed simultaneously using a fluorine-deficient fluorocarbon plasma etchant.

16. The method of claim 7 wherein forming the source and drain regions comprises:

forming first source and drain regions having a first conductivity type in a first portion of the semiconductor substrate having a second conductivity type and forming second source and drain regions having a second conductivity type in a second portion of the semiconductor substrate having a first conductivity type.

* * * * *